(12) United States Patent
Dowhower et al.

(10) Patent No.: US 9,689,895 B2
(45) Date of Patent: Jun. 27, 2017

(54) TEST CONNECTOR RETAINING HARNESS ASSEMBLY

(71) Applicant: THE BOEING COMPANY, Chicago, IL (US)

(72) Inventors: Thomas E. Dowhower, Summerville, SC (US); Heath W. Haga, Mount Pleasant, SC (US); Peter M. Heinrich, Mount Pleasant, SC (US); Ricky M. Peterson, Ladson, SC (US)

(73) Assignee: The Boeing Company, Chicago, IL (US)

( * ) Notice: Subject to any disclaimer, the term of this patent is extended or adjusted under 35 U.S.C. 154(b) by 147 days.

(21) Appl. No.: 14/827,449

(22) Filed: Aug. 17, 2015

(65) Prior Publication Data

US 2017/0052212 A1    Feb. 23, 2017

(51) Int. Cl.
| | |
|---|---|
| *H01R 13/62* | (2006.01) |
| *H01R 13/64* | (2006.01) |
| *G01R 1/04* | (2006.01) |
| *H01R 13/502* | (2006.01) |
| *G01R 31/00* | (2006.01) |
| *H01R 13/639* | (2006.01) |

(52) U.S. Cl.
CPC ......... *G01R 1/0416* (2013.01); *G01R 31/008* (2013.01); *H01R 13/502* (2013.01); *H01R 13/6395* (2013.01); *H01R 13/6392* (2013.01)

(58) Field of Classification Search
CPC ...... G01R 1/0416; G01R 31/008; G01R 1/04; G01R 31/00; H01R 13/502; H01R 13/6395; H01R 13/6392

USPC ................. 439/373, 371, 369, 208
See application file for complete search history.

(56) References Cited

U.S. PATENT DOCUMENTS

| | | | |
|---|---|---|---|
| 5,013,258 A | 5/1991 | Schaef | |
| 5,655,924 A * | 8/1997 | Cross ................ | H01R 13/6395 439/369 |
| 2009/0286430 A1 | 11/2009 | Van Den Meersschaut | |

FOREIGN PATENT DOCUMENTS

JP          2006031967          2/2006

OTHER PUBLICATIONS

Machine translation for JP 2006 031 967 (A).*
Partial European Search Report for EP 16184206.7-1801, send Jan. 5, 2017.

* cited by examiner

*Primary Examiner* — Javaid Nasri
(74) *Attorney, Agent, or Firm* — Joseph M. Butscher; The Small Patent Law Group, LLC (57) ABSTRACT

An electrical system may include a first electrical connector configured to be coupled to an electrical panel, a second electrical connector configured to be coupled to a testing device that is configured to test components coupled to the electrical panel, and a retaining harness assembly that removably connects to the first and second electrical connectors to maintain a secure mating relationship between the first and second electrical connectors.

23 Claims, 9 Drawing Sheets

TEST CONNECTOR RETAINING HARNESS ASSEMBLY

FIELD OF THE DISCLOSURE

Embodiments of the present disclosure generally relate to systems and methods for connecting electrical connectors together, and, more particularly, to systems and methods for securely connecting electrical connectors together with a retaining harness assembly.

BACKGROUND OF THE DISCLOSURE

Various components within a commercial aircraft are tested before the aircraft is delivered to a customer, and/or before and after flights. For example, a galley within a cabin of an aircraft may include various devices, or be in communication with systems and the like, that are electrically tested. A first electrical connector, such as a shipside connector, may be coupled to a main electrical board and/or power panel within the galley. A testing device may be configured to electrically couple to the first electrical connector through a second electrical connector, such as a test connector. The first and second electrical connectors may be removably connected together and the testing device may then be used to test one or more electrical responses or characteristics of various systems, devices, components, and the like within the aircraft.

Typically, a shipside connector in an aircraft galley removably connects to a test connector through a threaded interface. The shipside connector may be a relatively large connector having an outer diameter that is 2 inches or greater. Additionally, the shipside connector includes a torque ring that is configured to prevent the shipside connector from rotating when connected to the test connector. The torque ring is used to securely tighten the connection between the shipside connector and the test connector. Once securely connected together, the torque ring prevents the connectors from rotating with respect to one another. In order to connect the shipside connector to the test connector, the torque ring is torqued or otherwise rotated in order to provide a secure connection between the shipside connector and the test connector. In general, a high degree of force (for example, over sixty pounds of pressure) is used to rotate the torque ring in order to secure the two connectors together.

In order to disconnect the test connector from the shipside connector, the securing force of the torque ring needs to be overcome. Typically, an individual, such as a maintenance technician, uses one or more strap wrenches to engage the torque ring in order to disconnect the connectors from one another. Often, the time it takes to disconnect a single test connector from the shipside connector may exceed thirty minutes. The force used to disconnect the connectors, as well as the awkward positions used to engage the torque ring with one or more strap wrenches, may lead to discomfort and injuries. For example, individuals often suffer cuts to their hands, repetitive stress injuries (such as carpel tunnel syndrome), stress and strain to muscles (such as in arms and shoulders), and the like when connecting and disconnecting the connectors. Further, the high levels of force used to disconnect the test connector from the shipside connector may cause damage to portions of the connectors, testing equipment, or components within the aircraft.

A grip force used to loosen a test connector within a galley of an aircraft is often exerted with an awkward wrist posture in order to manipulate a hand or strap wrench into a firm position around a torque ring of a shipside connector. Due to the awkward wrist position, an individual may be susceptible to injury. As noted above, the force used to tighten and loosen the torque ring often exceeds sixty pounds. In general, the task of disconnecting a test connector from a shipside connector within a galley of an aircraft represents a high risk procedure that leads to numerous hand and wrist injuries.

Accordingly, a need exists for a safer and simpler system and method of connecting and disconnecting a test connector with respect to a shipside connector of an aircraft.

SUMMARY OF THE DISCLOSURE

Certain embodiments of the present disclosure provide an electrical system that may include a first electrical connector (such as a shipside connector within a galley of an aircraft) configured to be coupled to an electrical panel, a second electrical connector (such as test connector) configured to be coupled to a testing device that is configured to test components coupled to the electrical panel, and a retaining harness assembly that removably connects to the first and second electrical connectors to maintain a secure mating relationship between the first and second electrical connectors.

In at least one embodiment, the first and second electrical connectors may be configured to mate together in a linear, non-rotational direction. One or both of the first and second electrical connectors may be devoid of a threaded connection interface. The retaining harness assembly may bias the first electrical connector toward the second electrical connector.

In at least one embodiment, the retaining harness assembly may include a rear wall connected to opposed lateral walls. A connecting chamber may be defined between the rear wall and the lateral walls. The retaining harness assembly may also include a lower ledge separated from an upper ledge by a flange-receiving slot. A flange of the second electrical connector may be received and retained within the flange-receiving slot. The lower ledge may be configured to exert a first retaining force into the flange. A retaining collar may secure around a portion of a backplane of the second electrical connector and may abut into a torque ring of the second electrical connector. The retaining collar may exert a second retaining force into the torque ring. The retaining harness assembly may also include one or more lead-in walls that connect to the flange-receiving slot. The retaining collar may include one or more recessed areas configured to conform to a portion of an outer surface of the backplane. The opposed lateral walls may be configured to be deflected into an open position in order to remove the retaining harness assembly from the first and second electrical connectors.

In at least one embodiment, the retaining harness assembly may include a securing strap that abuts into a flange of the second electrical connector. The securing strap may exert a first retaining force into the flange. The retaining harness assembly may also include at least one retaining arm having a protuberance that abuts into a backplane of the first electrical connector and is supported over an edge of a torque ring. The protuberance may exert a second retaining force into the torque ring. The retaining arm(s) is configured to be deflected into an open position in order to disconnect the retaining harness assembly from the first and second electrical connectors.

In at least one embodiment, the retaining harness assembly may include a retainer housing secured around a portion of a backshell of the first electrical connector, a spring override ring secured around a portion of the retainer housing and operatively coupled to a torque ring of the first electrical connector, and a biasing spring having a first end retained by the retainer housing. The spring override ring may be configured to be rotated between a first position in which the biasing spring biases the spring override ring into the torque ring, and a second position in which the biasing spring is compressed toward the retainer housing. Compression of the biasing spring toward the retainer housing allows the torque ring to be rotated.

The retainer housing may include a shroud that retains the first end of the biasing spring. The spring override ring may connect to the torque ring through a ratchet interface. The spring override ring may include one or more inwardly-directed protuberances that are retained within one or more tracks formed in the retainer housing. The inwardly-directed protuberance(s) may be configured to vary a compression of the biasing spring as the spring override ring is rotated relative to the retainer housing and the torque ring.

DETAILED DESCRIPTION OF THE DISCLOSURE

The foregoing summary, as well as the following detailed description of certain embodiments will be better understood when read in conjunction with the appended drawings. As used herein, an element or step recited in the singular and preceded by the word "a" or "an" should be understood as not necessarily excluding the plural of the elements or steps. Further, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional elements, which may or may not include that property.

Certain embodiments of the present disclosure provide a retaining harness assembly that is configured to securely, safely, easily, and efficiently secure a first electrical connector, such as a test connector, to a second electrical connector, such as a shipside connector within a galley of an aircraft. In at least one embodiment, the first electrical connector and/or the second electrical connector may be devoid of a threaded mating interface. In at least one embodiment, the connectors may not connect together through rotatable mating. Instead, the connectors may be initially mated through a linear direction (such as the first electrical connector plugging into the second electrical connector in a single linear direction). The retaining harness assembly may then be used to ensure that the first and second electrical connectors remain securely mated together. The retaining harness assembly may provide a positive locking feature. For example, the retaining harness assembly may bias the connectors towards each other. In at least one embodiment, the retaining harness assembly biases the first and second electrical connectors together and may securely mate to one or both of the connectors, such as through a snap fit.

An individual does not need to use a strap wrench to disconnect the connectors together. Instead, the individual may simply engage the retaining harness assembly in a disconnecting position and then remove the first and second electrical connectors from one another in a simple, single linear direction (such as the first electrical connector unplugging from the second electrical connector). Accordingly, the time it takes to disconnect the connectors from one another is substantially reduced. The retaining harness assembly may be removed through engagement of one or more features, such as protuberances, in order to spread the retaining harness assembly into an open position, which allows the retaining harness assembly to be removed from the connectors.

The retaining harness assembly eliminates, minimizes, or otherwise reduces a possibility of injury and damage to the connectors and aircraft, for example. Further, the retaining harness assembly provides a safety device that prevents energized connectors from being disconnected.

Certain embodiments of the present disclosure provide a retaining harness assembly that is configured to disengage a torque ring (or other such anti-rotation device) of a connector, such as that of a shipside connector that connects to a galley of an aircraft, for example. The retaining harness assembly is configured to allow the connector to be quickly and easily disconnected from another connector, such as a test connector. In at least one embodiment, the retaining harness assembly may include a spring override member.

Figure 1:
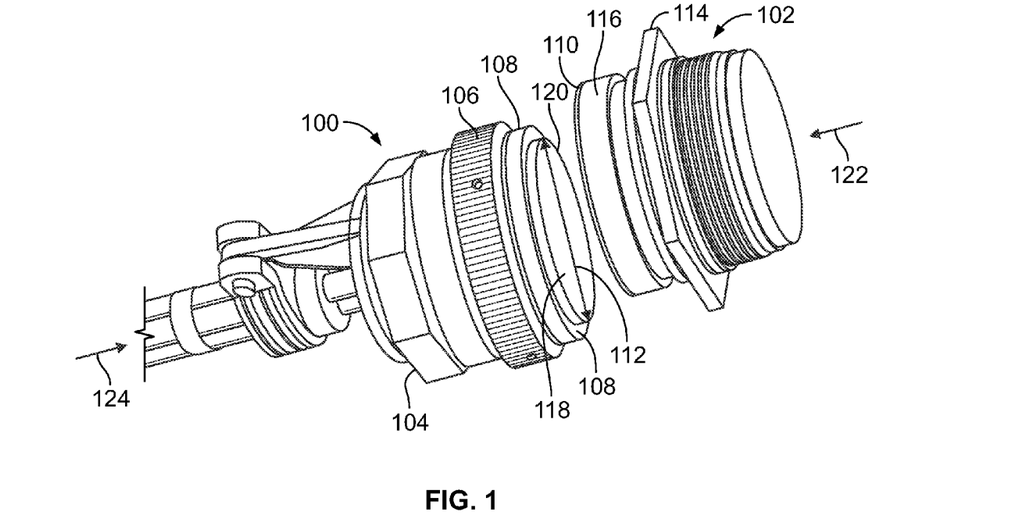
FIG. 1 is a diagrammatic representation of a perspective lateral view of a first electrical connector disconnected from a second electrical connector, according to an embodiment of the present disclosure.

FIG. 1 is a diagrammatic representation of a perspective lateral view of a first electrical connector 100 disconnected from a second electrical connector 102, according to an embodiment of the present disclosure. The first and second electrical connectors 100 and 102 are configured to convey electrical signals therebetween when connected together. The first electrical connector 100 may be a shipside connector that is operatively coupled to a main electrical board or power panel within a galley of an aircraft through a cable, for example. The second electrical connector 102 may be a test connector that is operatively coupled to a testing device through a cable, for example.

The first electrical connector 100 may include a backplane 104 that connects to a torque ring 106 and a connection interface 108. The connection interface 108 is configured to mate with a reciprocal connection interface 110 of the second electrical connector 102. The connection interface 108 may have a diameter 112 that is at least 2 inches. Alternatively, the diameter 112 may be less than 2 inches. As shown, the connection interface 108 may be circular. In at least one other embodiment, the connection interface 108 and the connection interface 110 may be various other shapes and sizes, such as square, triangular, elliptical, ovoid, and/or the like.

The second electrical connector 102 may include the connection interface 110 that connects to a flat planar flange 114 that extends radially outward from the connection interface 110. The connection interface 110 may include an outer circumferential rim 116 that defines a contact chamber (hidden from view) that is configured to mate with a contact chamber 118 of the first electrical connector 100. The contact chamber of the second electrical connector 102 may include a plurality of electrical contacts (not shown) that are configured to electrically connect to a corresponding number of reciprocal electrical contacts (not shown) within the contact chamber 118 of the first electrical connector 100 when the first electrical connector 100 is connected to the second electrical connector 102.

As shown, the first electrical connector 100 may include a receptacle 120. The receptacle 120 is configured to mate with a rim 116 of the second electrical connector 102. Optionally, the first electrical connector 100 may include the plug, and the second electrical connector 102 may include the receptacle.

In order to mate the first electrical connector 100 to the second electrical connector 102, the connection interfaces 108 and 110 are axially aligned with one another so that the plug 116 is axially aligned with the receptacle 120. Once aligned, the second electrical connector 102 is linearly urged toward the first electrical connector 100 in the direction of linear arrow 122 (or the first electrical connector 100 is linearly urged toward the first electrical connector in the direction of linear arrow 124). In this manner, the receptacle 120 of the first electrical connector 100 linearly receives the rim 116 of the second electrical connector 102. The first electrical connector 100 mates with the second electrical connector through a single, simple linear, non-rotational motion, such as a plugging motion. The first and second electrical connectors 100 and 102 are not rotated into a mating connection. In at least one embodiment, the connection interfaces 108 and 110 of the respect first and second electrical connectors 100 and 102 are devoid of threads or other such rotatable connection interfaces.

Figure 2:
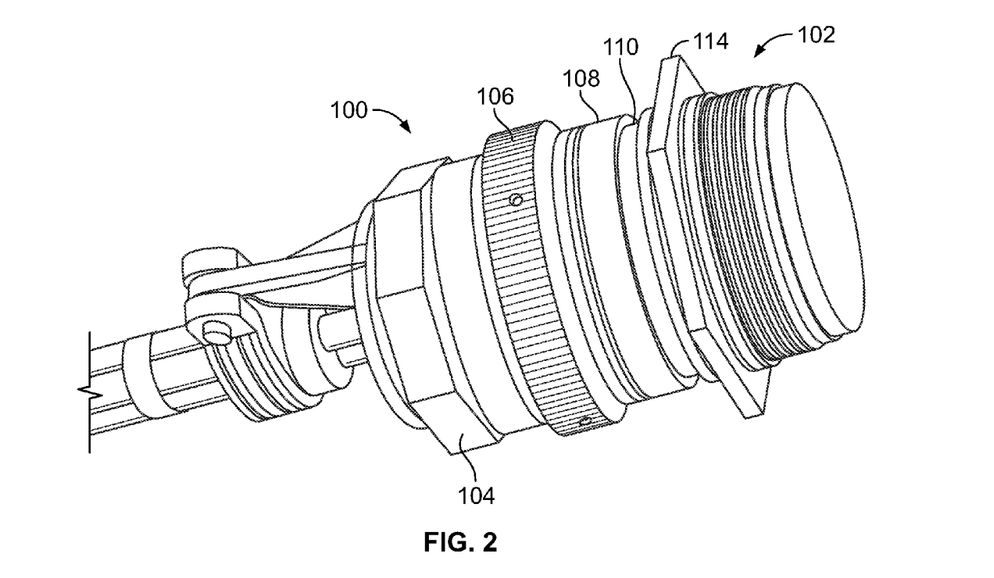
FIG. 2 is a diagrammatic representation of a perspective lateral view of a first electrical connector initially mated to a second electrical connector, according to an embodiment of the present disclosure.

FIG. 2 is a diagrammatic representation of a perspective lateral view of the first electrical connector 100 initially mated with the second electrical connector 102, according to an embodiment of the present disclosure. As described above, the first and second electrical connectors 100 and 102 are linearly mated with each other (in contrast to being to be rotationally mated). After the first and second electrical connectors 100 and 102 are initially mated, as shown in FIG. 2, a retaining harness assembly (not shown in FIG. 2) is used to ensure that the first and second electrical connectors 100 and 102 remain securely mated to one another. That is, the retaining harness assembly is configured to maintain a secure mating relationship between the first and second electrical connectors 100 and 102.

Figure 3:
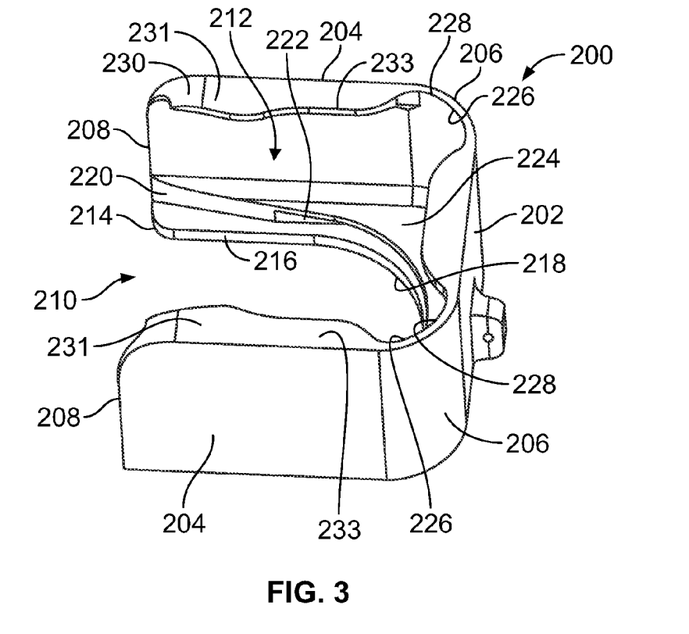
FIG. 3 is a diagrammatic representation of a perspective top view of a retaining harness assembly, according to an embodiment of the present disclosure.
Figure 4:
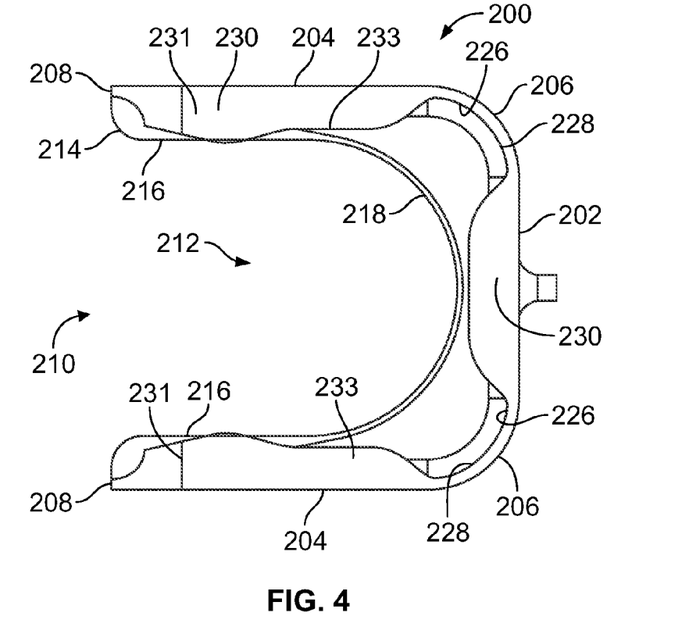
FIG. 4 is a diagrammatic representation of a top view of a retaining harness assembly, according to an embodiment of the present disclosure.
Figure 5:
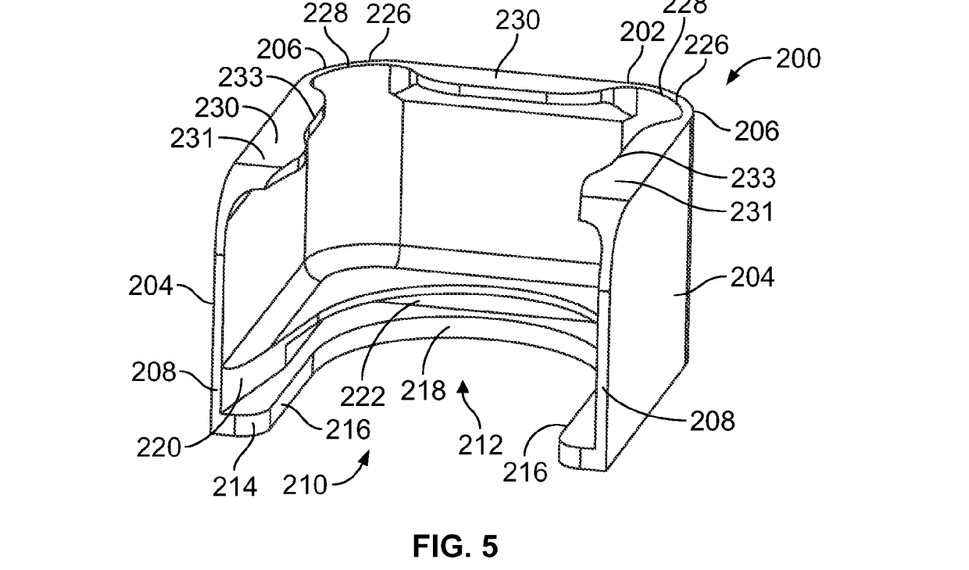
FIG. 5 is a diagrammatic representation of a perspective front view of a retaining harness assembly, according to an embodiment of the present disclosure.

FIG. 3 is a diagrammatic representation of a perspective top view of a retaining harness assembly 200, according to an embodiment of the present disclosure. FIG. 4 is a diagrammatic representation of a top view of the retaining harness assembly 200. FIG. 5 is a diagrammatic representation of a perspective front view of the retaining harness assembly 200. Referring to FIGS. 3-5, the retaining harness assembly 200 may be integrally molded and formed as a single piece of plastic. Alternatively, the retaining harness assembly 200 may be formed of separate and distinct portions that are secured together, such as through fasteners, adhesives, and/or the like. Also, alternatively, the retaining harness assembly 200 may be formed of various other materials, such as one or more metals.

The retaining harness assembly 200 may include a rear wall 202 connected to opposed lateral walls 204. The rear wall 202 may connect to the lateral walls 204 through curved transition walls 206. The rear wall 202 may be perpendicular to the lateral walls 204.

Each lateral wall 204 includes a free end 208. That is, the retaining harness assembly 200 may not include a front wall that extends between the lateral walls 204. Instead, an opening 210 is formed between the free ends 208 of the lateral walls 204 and leads to a connecting chamber 212 that is defined between interior surfaces of the lateral wall 204 and the rear wall 202.

As shown, a lower ledge 214 extends from lower portions of the lateral walls 204 and the rear wall 202 and extends inwardly into the connecting chamber 212. The lower ledge 214 may include linear edges 216 that extend inwardly from the lateral wall 204. The linear edges 216 connect to a semi-circular edge 218 that inwardly extends from the rear wall 202 into the connecting chamber 212. The shape and size of the lower ledge 214, including the linear edges 216 and the semi-circular edge 218, may be sized and shaped to conform to a size and shape of an outer surface of a portion of the second electrical connector 102 (shown in FIGS. 1 and 2).

Inwardly-angled lead-in walls 220 may extend upwardly from the lower ledge 214 proximate to the free ends 208 of the lateral walls 204. The lead-in walls 220 connect to a flange-receiving slot 222 positioned between the lower ledge 214 and an upper ledge 224, which may follow the contour of the lower ledge 214 within the connecting chamber 212 proximate to the rear wall 202. Optionally, the retaining harness assembly 200 may not include the lead-in walls 220.

A retaining collar 230 may extend from upper edges of the lateral walls 204 and the rear wall 202. The retaining collar 230 may be inwardly bent and perpendicular with respect to the lateral walls 204 and the rear wall 202. The retaining collar 230 may be parallel to the lower ledge 214 and the upper ledge 224. Inner edges of the retaining collar 230 may be sized and shaped to conform to outer surfaces of a portion of the first electrical connector 100 (shown in FIGS. 1 and 2).

The retaining collar 230 may include recessed areas 226 proximate to the curved transition walls 206. The recessed areas 226 may be divots formed in the retaining collar 230. In at least one embodiment, the recessed areas 226 may be areas in which no portion of the retaining collar 230 extends over the connecting chamber 212. For example, the retaining collar 230 may not extend over the curved transition walls 206. The recessed areas 220 may include arcuate surfaces 228 that provide a thinned area of the retaining collar 230 (or optionally, an area that is devoid of the retaining collar 230). As such, the recessed areas 226 provide the retaining collar 230 with resilient, flexible areas that are configured to allow the lateral walls 204 to smoothly deflect, such as by flexing open with respect to the rear wall 202 when an outwardly-directed flexing force is exerted into the lateral walls 204 (for example, when an individual gasps the free ends 208 and spreads the lateral walls 204 open). Alternatively, the retaining collar 230 may not include the recessed areas 220.

Figure 6:
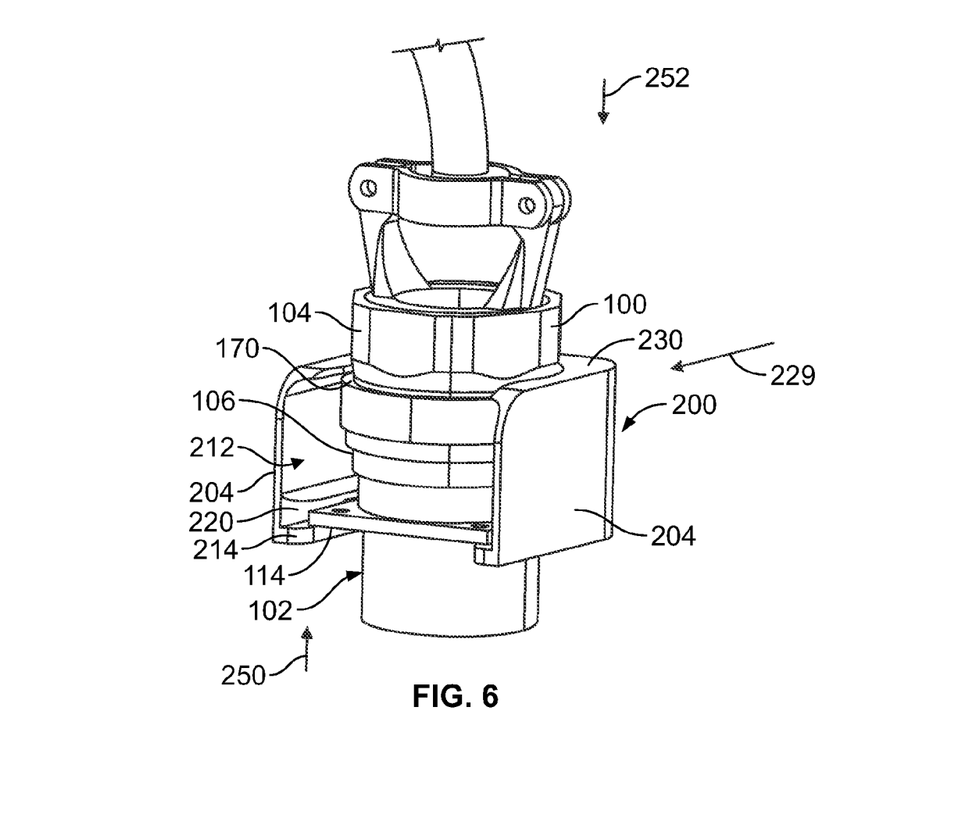
FIG. 6 is a diagrammatic representation of a perspective front view of a retaining harness assembly securely connecting a first electrical connector to a second electrical connector, according to an embodiment of the present disclosure.

FIG. 6 is a diagrammatic representation of a perspective front view of the retaining harness assembly 200 securely connecting the first electrical connector 100 to the second electrical connector 102, according to an embodiment of the present disclosure. FIG. 6 shows an electrical system, such as a system for securely, safely, efficiently, and easily maintaining a secure connection between the first and second electrical connectors 100 and 102. The retaining harness assembly 200 is used to ensure a secure mated connection between the first and second electrical connectors 100 and 102. The retaining harness assembly 200 allows the first and second electrical connectors 100 and 102 to securely engage each other, connect, and securely mate together without the connectors 100 and 102 or the retaining harness assembly 200 being rotated (for example, torqued) relative to another component.

As noted above, the first and second electrical connectors 100 and 102 are first mated together in a linear, non-rotational direction. After the first and second electrical connectors 100 and 102 are initially mated together, the retaining harness assembly 200 is secured around portions of the first and second electrical connectors 100 and 102. The retaining harness assembly 200 is configured to bias portions of the first and second electrical connectors 100 and 102 toward one another in order to maintain a secure mating relationship therebetween. For example, the retaining harness assembly 200 may be configured to clamp the first and second electrical connectors 100 and 102 together.

Referring to FIGS. 1-6, in order to connect the retaining harness assembly 200 to the first and second electrical connectors 100 and 102, respectively, the lead-in walls 220 are aligned with the flange 114 of the second electrical connector 102 and the retaining collar 230 is aligned over an upper edge 170 of the torque ring 106 of the first electrical connector 100. The retaining harness assembly 200 is then urged toward the first and second electrical connectors 100 and 102.

As the retaining harness assembly 200 is urged onto the first and second electrical connectors 100 and 102 in the direction of arrow 229 (shown in FIG. 6), outer edges of the flange 114 slide over the lead-in walls 220 and are directed into the flange-receiving slot 222 (shown in FIGS. 3 and 5). At the same time, the upper edge 170 of the torque ring 106 is trapped under the retaining collar 230.

As shown in FIGS. 3-5, distal portions 231 of the retaining collar 230 may be expanded so that a distance between opposed distal portions 231 is less than a diameter of the backplane 104 around which the retaining collar 230 secures. As such, as the distal portions 231 slide over the outer surface of the backplane 104, the lateral walls 204 may outwardly deflect. With continued urging of the retaining harness assembly 200 towards and onto the first and second electrical connectors 100 and 102 in the direction of arrow 229, recessed interior edges 233 of the retaining collar 230 engage around the outer surface of the backplane 104, and the lateral walls 204 deflect back to an at-rest position, such that opposed distal portions 231 provide a barrier that traps the backplane 106 within the retaining collar 230. The retaining collar 230 prevents the first electrical connector 100 (and therefore the second electrical connector 102 that connects to the first electrical connector 100) from axially, radially, or longitudinally shifting.

In the securely mated position, the flange 114 is nestled within the flange-receiving slot 222 and supported by the lower ledge 214, while the retaining collar 230 securely wraps around a portion of the backplane 104 and extends over the upper edge 170 of the torque ring 106. The lower ledge 214 exerts a retaining force into the flange 114 in the direction of arrow 250, while the retaining collar 230 exerts a retaining force into the upper edge 170 of the torque ring 106 in the direction of arrow 252, which is opposite from the direction of arrow 250. Therefore, the retaining harness assembly 200 provides opposed retaining forces that ensure that the first and second electrical connectors 100 and 102 remain securely mated together. The retaining harness assembly 200 effectively clamps the first and second electrical connectors 100 and 102 together. The retaining harness assembly 200 provides a bracing support that prevents the first electrical connector 100 from dislodging from the second electrical connector 102.

In order to disconnect the first electrical connector 100 from the second electrical connector 102, the lateral walls 204 of the retaining harness assembly 200 may be grasped and spread open. When the lateral walls 204 are spread open, the distal portions 231 of the retaining collar 230 disengage from the backplane 104, and the first and second electrical connectors 100 and 102 may be removed from the connecting chamber 212 (such as by moving the retaining harness assembly 200 in a linear direction that is substantially perpendicular to a longitudinal axis that passes through the centers of the first and second electrical connectors 100 and 102). After the retaining harness assembly 200 is removed from the connectors 100 and 102, the first electrical connector 100 may be linearly disconnected from the second electrical connector 102, or vice versa, such as through a simple unplugging movement.

Figure 7:
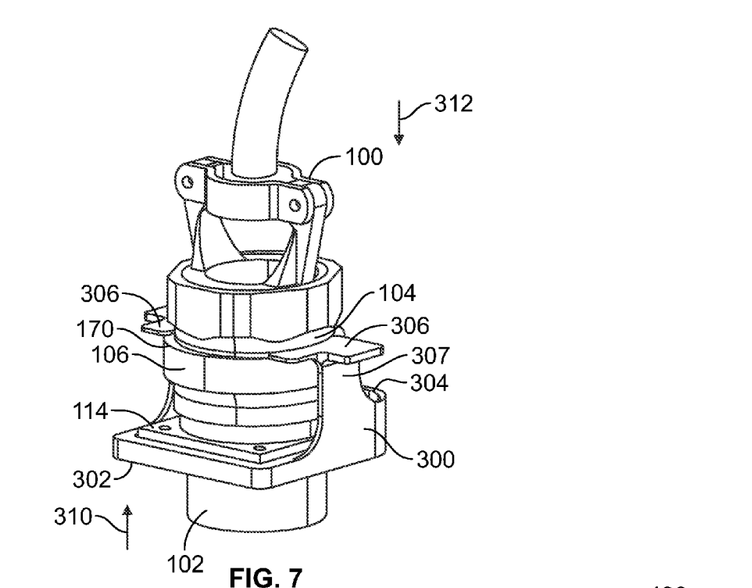
FIG. 7 is a diagrammatic representation of a perspective front view of a retaining harness assembly securely connecting a first electrical connector to a second electrical connector, according to an embodiment of the present disclosure.

FIG. 7 is a diagrammatic representation of a perspective front view of a retaining harness assembly 300 securely connecting the first electrical connector 100 to the second electrical connector 102, according to an embodiment of the present disclosure. FIG. 7 shows an electrical system that is configured to maintain a secure mating relationship between the first and second electrical connectors 100 and 102. The retaining harness assembly 300 is similar to the retaining harness assembly 200 (shown in FIGS. 3-6).

The retaining harness assembly 300 may include a securing strap 302 that abuts into a lower surface of the flange 114. The securing strap 302 may connect to upwardly extending retaining arms 304, each of which may include a protuberance 306 that abuts into the backplane 104 and is supported over the edge 170 of the torque ring 106. The protuberances 306 may extend from distal ends of the retaining arms 304, and may be perpendicular to extension beams 307 of the retaining arms 304. More or less retaining arms 304 than shown may be used. The protuberance 306 may be or otherwise include a tab, clasp, latch, barb, or the like.

As shown, the securing strap 302 exerts a retaining force into the flange 114 in a first direction 310, while the protuberances 306 exert retaining forces into the edge 170 of the torque ring 106 in a second direction 312 that is opposite the first direction 310. Accordingly, the retaining harness assembly 300 provides retaining forces that ensure that the first electrical connector 100 remains securely mated with the second electrical connector 102. The retaining harness assembly 300 is configured to maintain the first and second electrical connectors 100 and 102 in a secure mated relationship. Similar to the retaining harness assembly 200 (shown in FIGS. 3-6), the retaining harness assembly 300 is configured to clamp the first and second electrical connectors 100 and 102 together.

In order to disengage the retaining harness assembly 300 from the first and second electrical connectors 100 and 102, the protuberances 306 may be engaged (for example, grasped) by an individual and spread outwardly from one another, thereby deflecting the retaining arms 304 apart. As the protuberances 306 spread outwardly, the protuberances 306 disengage from the torque ring 106. As such, the retaining harness assembly 300 may disconnect from a secure clamping position and slide down toward the flange 114, onto which the protuberances 306 may catch. Optionally, the retaining harness assembly 300 may include an opening between wall portions so that the retaining harness assembly 300 may be completely removed from the second electrical connector 102. After the retaining harness assembly 300 disengages the first electrical connector 100, the first electrical connector 100 may be disconnected from the second electrical connector 102, or vice versa, in a linear direction, such as through an unplugging movement.

Figure 8:
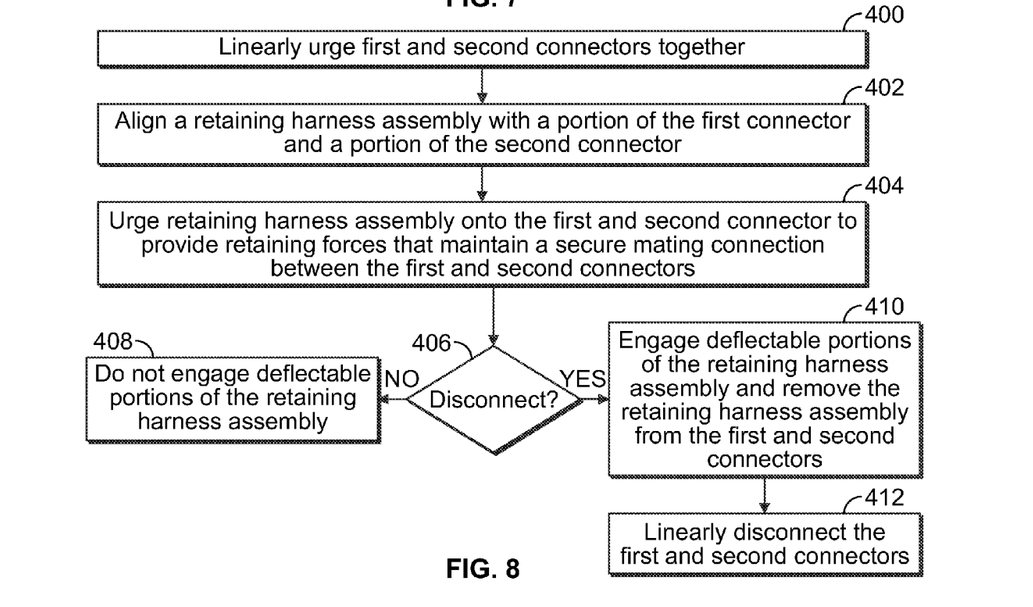
FIG. 8 illustrates a flow chart of a method of selectively connecting and disconnecting first and second electrical connectors, according to an embodiment of the present disclosure.

FIG. 8 illustrates a flow chart of a method of selectively connecting and disconnecting first and second electrical connectors, according to an embodiment of the present disclosure. The method begins at 400, in which first and second electrical connectors are linearly urged together. For example, the first and second electrical connectors may be plugged together in a linear, non-rotational direction. In at least one embodiment, the first electrical connector is a shipside connector that is coupled to a main electrical board and/or power panel of the galley, while the second electrical connector is a test connector coupled to an electrical testing device.

At 402, a retaining harness assembly is aligned with a portion of the first electrical connector and a portion of the second electrical connector. At 404, the retaining harness assembly is urged onto the first and second electrical connectors to provide opposed retaining forces that maintain a secure mating connection between the first and second electrical connectors. As the retaining harness assembly is urged onto the first and second electrical connectors, deflectable portions of the retaining harness assembly may deflect outwardly and snap back to an at-rest position to securely trap a portion of at least one of the first and second electrical connectors therebetween.

At 406, it is determined whether the first and second electrical connectors are to be disconnected. If not, at 408, deflectable portions of the retaining harness assembly are not engaged by an individual. If so, the method proceeds to 410, in which an individual engages (for example, grasps) the deflectable portions and removes the retaining harness assembly from the first and second electrical connectors. Then, at 412, with the retaining harness assembly removed from a securing connection, the first and second electrical connectors may be linearly disconnected, such as by being unplugged.

Figure 9:
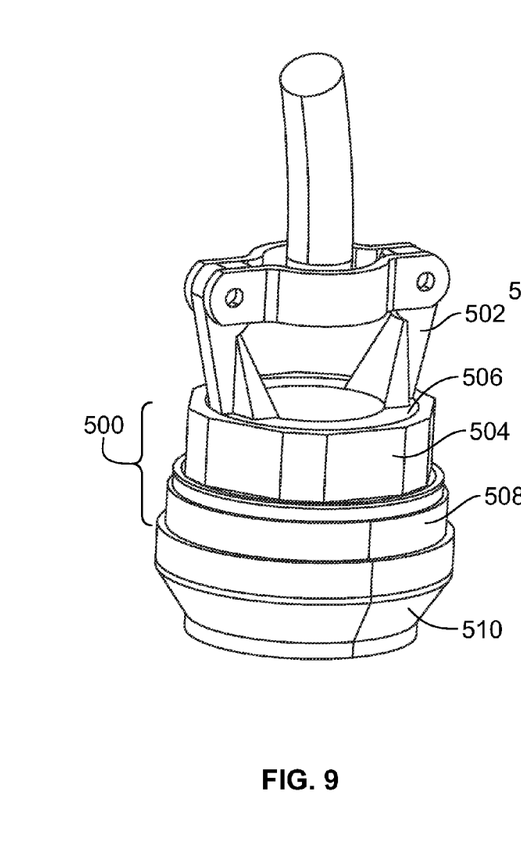
FIG. 9 is a diagrammatic representation of a perspective front view of a retaining harness assembly secured to a first electrical connector, according to an embodiment of the present disclosure.

FIG. 9 is a diagrammatic representation of a perspective front view of a retaining harness assembly 500 secured to a first electrical connector 502, according to an embodiment of the present disclosure. The first electrical connector 502 may be similar to the first electrical connector described above. The retaining harness assembly 500 may include a retainer housing 504 secured around a portion of a backshell 506 of the first electrical connector 502, and a spring override ring 508 secured around a portion of the retainer housing 504 and operatively coupled to a torque ring 510.

Figure 10:
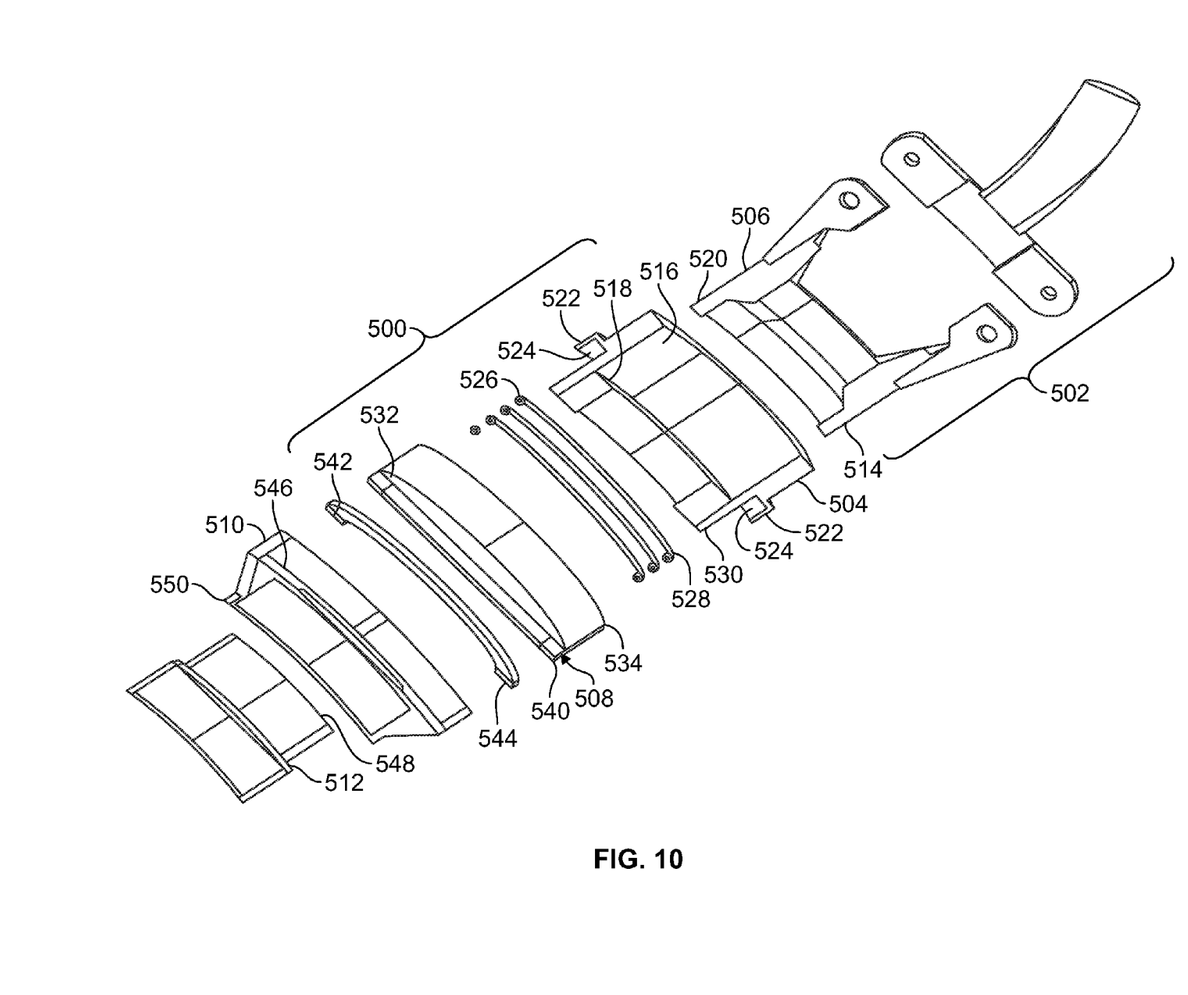
FIG. 10 is a diagrammatic representation of a perspective exploded view of a first electrical connector and a retaining harness assembly, according to an embodiment of the present disclosure.

FIG. 10 is a diagrammatic representation of a perspective exploded view of the first electrical connector 502 and the retaining harness assembly 500, according to an embodiment of the present disclosure. FIG. 10 shows an electrical system configured to maintain a secure mating relationship between the first electrical connector 502 and a second electrical connector, such as the second electrical connector 102 shown in FIG. 1. The backshell 506 may include a cylindrical main body 514 that fits within a reciprocal channel 516 formed in the retainer housing 504. The retainer housing 504 may include an interior ledge 518 that supports a lower base edge 520 of the backshell 506.

The retainer housing 504 may also include an outer circumferential shroud 522. The shroud 522 may include an open ended channel 524 that is configured to receive a portion of a biasing spring 526. The spring 526 includes an end 528 that abuts into an interior surface of the shroud 522. The spring 526 wraps around an override end 530 of the retainer housing 504 and is urged into an internal annular ledge 532 of the spring override ring 508. An outer circumferential wall 534 of the spring override ring 508 may surround an outer circumference of at least a portion of the spring 526.

The spring override ring 508 may also include a lower ratchet interface 540 that is configured to mate with a reciprocal upper ratchet interface 542 of a ratchet ring 544 that is positioned on a ledge 546 of the torque ring 510. As shown, the ratchet ring 544 may be a separate and distinct piece that lies within the torque ring 510. In at least one embodiment, the ratchet ring 544 may include securing members, such as splines, tabs, or the like, that are configured to be securely retained by reciprocal structures of the torque ring 510. In at least one other embodiment, the ratchet ring 544 may be an integral part of the torque ring 510. A connection interface 512 includes an insert 548 that is configured to be received and retained by a receptacle 550 of the torque ring 510. Alternatively, the connection interface 512 may include the receptacle while the torque ring 510 includes the plug.

Figure 11:
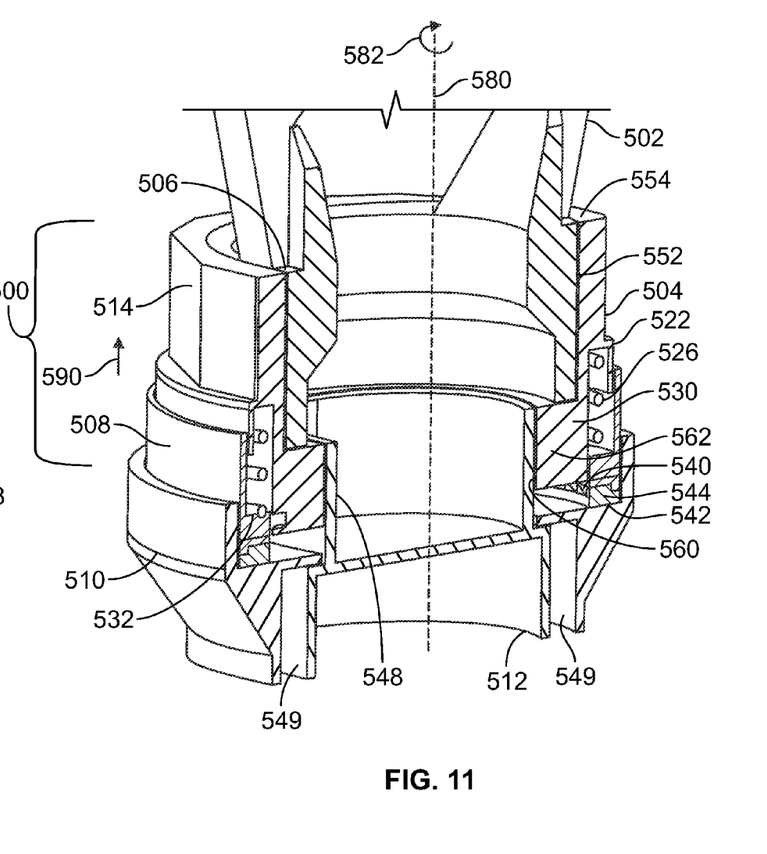
FIG. 11 is a diagrammatic representation of a perspective axial cross-sectional view of a first electrical connector secured to a retaining harness assembly, according to an embodiment of the present disclosure.

FIG. 11 is a diagrammatic representation of a perspective axial cross-sectional view of the first electrical connector 502 secured to the retaining harness assembly 500, according to an embodiment of the present disclosure. The backshell 506 may include a threaded outer interface 552 that threadably secures to a threaded inner interface 554 of the main body 514 of the retainer housing 504. Similarly, the plug 548 may include a threaded outer interface 560 that threadably secures to a threaded inner interface 562 of the override end 530 of the retainer housing 504. Thus, the connection interface 512 may threadably secure to the first electrical connector 502 through rotational engagement. Optionally, the connection interface 512 may secure to the retainer housing 504 through an interference fit, a press fit, bonding, fasteners, and/or the like.

As shown, a channel 549 is defined between an outer surface of connection interface 512 and an interior surface of the torque ring 512. A portion of a second electrical connector, such as the rim 116 of the connection interface 110 of the second electrical connector 102 (shown in FIG. 1) is configured to be positioned and secured within the connection interface 512.

In the connected position, the spring 526 biases the spring override ring 508 into the ratchet ring 544. In this position, the lower ratchet interface 540 of the spring override ring 508 securely engages the upper ratchet interface 542 of the ratchet ring 544, which is compressed into and retained by the torque ring 510. As such, the torque ring 510 prevents the first electrical connector 502 from being rotated relative to the second electrical connector (such as the second electrical connector 102) in the connected position.

In order to disconnect the first electrical connector 502 from the second electrical connector, the spring override ring 508 may be rotated about a central longitudinal axis 580 in the direction of arc 582. For example, the spring override ring 508 may be rotated a quarter turn in the direction of arc 582. As the spring override ring 508 is rotated in the direction of arc 582, one or more protuberances (such as posts, nubs, studs, or the like) extending inwardly from the spring override ring 508 engage the spring 526, which causes the spring 526 to retract upwardly in the direction of arrow 590 toward the shroud 522. As such, the force of the spring 526 exerted into the ledge 532 is released, and the lower ratchet interface 540 disengages from the upper ratchet interface 542. Accordingly, the torque ring 510 may then be rotated, which may threadably disengage the first electrical connector 502 from the second electrical connector (such as the second electrical connector 102 shown in FIG. 1).

In contrast to prior known torque rings that exert a constant resisting force into connectors that is overcome through relatively high amounts of force exerted by strap wrenches, for example, the override ring 508 may be easily rotated relative to the retainer housing 504 and the torque ring 510. As the override ring 508 is rotated in the direction of arc 582, the spring 526 is drawn towards the first electrical connector 502 (for example, the spring 526 compresses into a barrier surface of the shroud 522), which releases the securing bias between the spring override ring 508 and the torque ring 510. The spring 526 remains compressed toward the first electrical connector 502 until an individual rotates the override ring in an opposite direction from arc 582. Because the spring 526 may be compressed through operation of the override ring 508, the torque ring 510 may no longer secure to the second electrical connector at an elevated force. As such, the torque ring 510 may then be easily rotated in order to threadably disengage the first electrical connector 502 from the second electrical connector.

Figure 12:
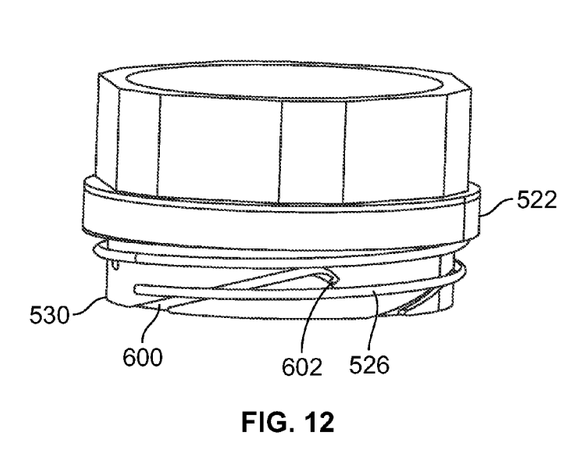
FIG. 12 is a diagrammatic representation of a front view of a spring secured around a portion of a retainer housing, according to an embodiment of the present disclosure.

FIG. 12 is a diagrammatic representation of a front view of the spring 526 secured around a portion of a retainer housing 504, according to an embodiment of the present disclosure. As shown, the override end 530 may include one or more angled tracks 600 formed therethrough. The angled track(s) 600 is configured to receive one or more inwardly directed protuberances of the spring override ring 508 (shown in FIG. 11, for example). As the spring override ring 508 is rotated in the direction of arc 582 (shown in FIG. 11), the protuberance(s) upwardly rotates in the track(s) 600, thereby compressing the spring 526 toward and/or into the shroud 522. An end 602 of a track 600 may provide a downwardly canted portion that is configured to secure a protuberance in a securely locked position, which ensures that the spring 526 remains compressed (and the torque ring 510, which is shown in FIG. 11, remains in a free rotational state).

Figure 13:
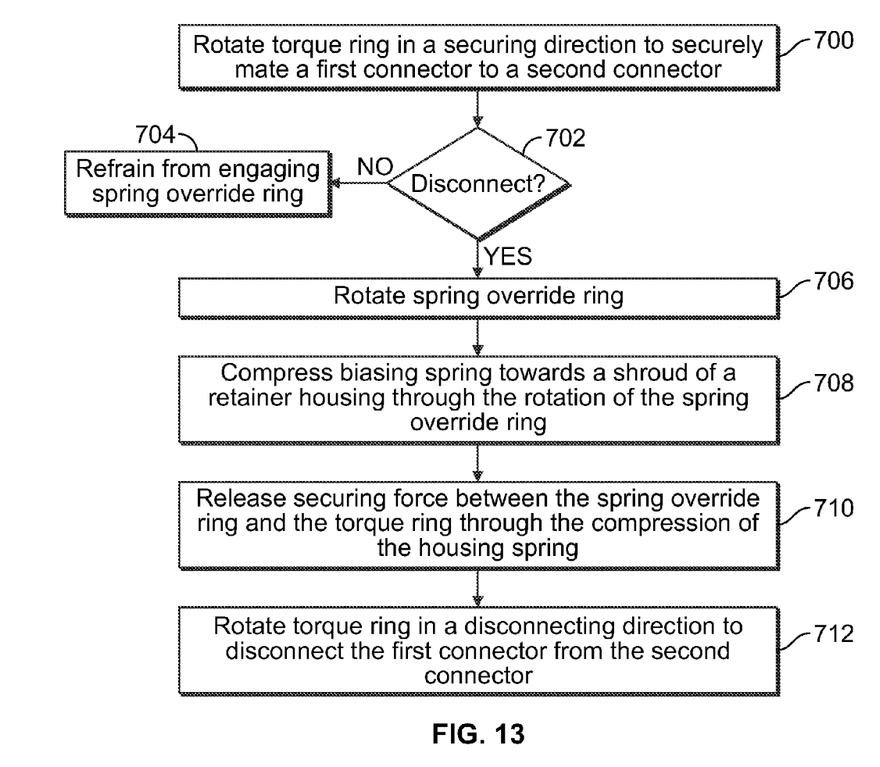
FIG. 13 illustrates a flow chart of a method of selectively connecting and disconnecting first and second electrical connectors, according to an embodiment of the present disclosure.

FIG. 13 illustrates a flow chart of a method of selectively connecting and disconnecting first and second electrical connectors, according to an embodiment of the present disclosure. The method begins at 700, in which a torque ring is rotated in a securing direction to securely mate a first electrical connector that is threadably connected to a second electrical connector. At 702, it is determined if the first electrical connector is to be disconnected from the second electrical connector. If not, the method proceeds to 704, in which an individual refrains from engaging a spring override ring.

If, however, the first electrical connector is to be disconnected from the second electrical connector, at 706, the spring override ring is rotated in relation to the torque ring and a retainer housing. For example, the spring override ring may be rotated a quarter turn in a direction that is opposite from the securing direction in which the torque ring was rotated.

At 708, as the spring override ring is rotated, a biasing spring secured between the spring override ring and the retainer housing is compressed toward a shroud of the retainer housing. At 710, a securing force between the spring override ring and the torque ring is released due to the compression of the biasing spring. After the securing force is diminished, the torque ring may be rotated in a disconnecting direction at 712 in order to threadably disconnect the first electrical connector from the second electrical connector.

Referring to FIGS. 1-13, embodiments of the present disclosure provide safe and simple systems and methods for securing a first electrical connector to a second electrical connector. The first electrical connector may be a shipside connector that is coupled to an electrical board or power panel of a galley within an aircraft, for example. The second electrical connector may be a test connector that is coupled to a testing device used to electrically test various components within the galley.

It has been found that embodiments of the present disclosure allow a shipside connector within a galley of an aircraft to be connected and disconnected to a test connector with less force than prior known systems and methods. It has been found that embodiments of the present disclosure reduce a likelihood of injury caused by connecting and/or disconnecting a shipside connector to a test connector. In contrast to prior known connectors that required high levels of connection and disconnection force exerted with strap wrenches, for example, embodiments of the present disclosure eliminate, minimize, or otherwise reduce a likelihood of injury to an individual.

Figure 14:
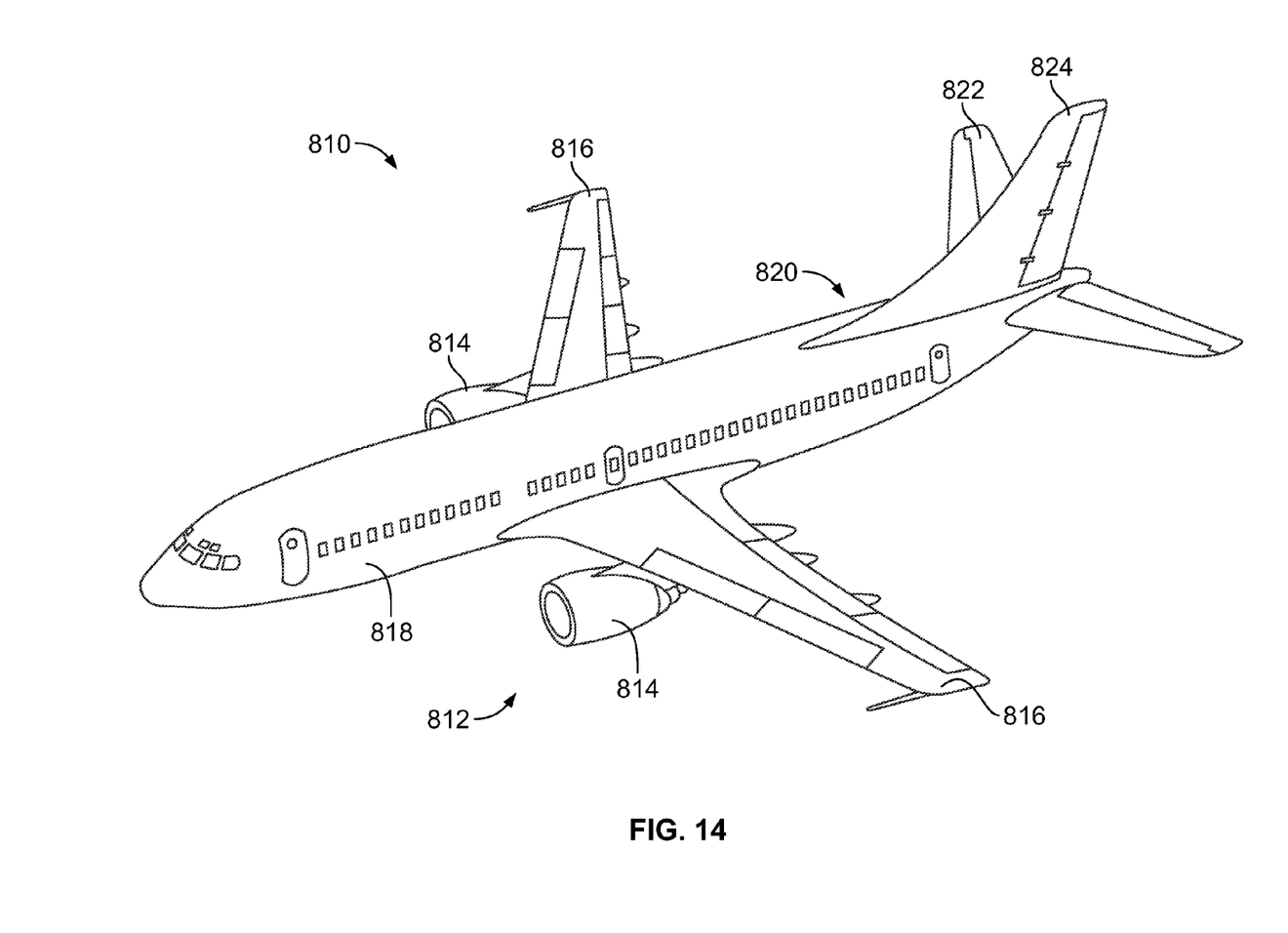
FIG. 14 is a diagrammatic representation of a perspective top view of an aircraft, according to an embodiment of the present disclosure.

FIG. 14 illustrates a perspective top view of an aircraft 810 (or aircraft assembly), according to an embodiment of the present disclosure. The aircraft 810 may include a propulsion system 812 that may include two turbofan engines 814, for example. Optionally, the propulsion system 812 may include more engines 814 than shown. The engines 814 are carried by wings 816 of the aircraft 810. In other embodiments, the engines 814 may be carried by a fuselage 818 and/or an empennage 820. The empennage 820 may also support horizontal stabilizers 822 and a vertical stabilizer 824.

The fuselage 818 of the aircraft 810 defines an internal cabin, which may include a cockpit, one or more work sections (for example, galleys, personnel carry-on baggage areas, and the like), one or more passenger sections (for example, first class, business class, and coach sections), and an aft section in which an aft rest area assembly may be positioned. Each of the sections may be separated by a cabin transition area, which may include a curtain assembly having a moveable curtain that may be selectively opened and closed within an aisle.

Figure 15:
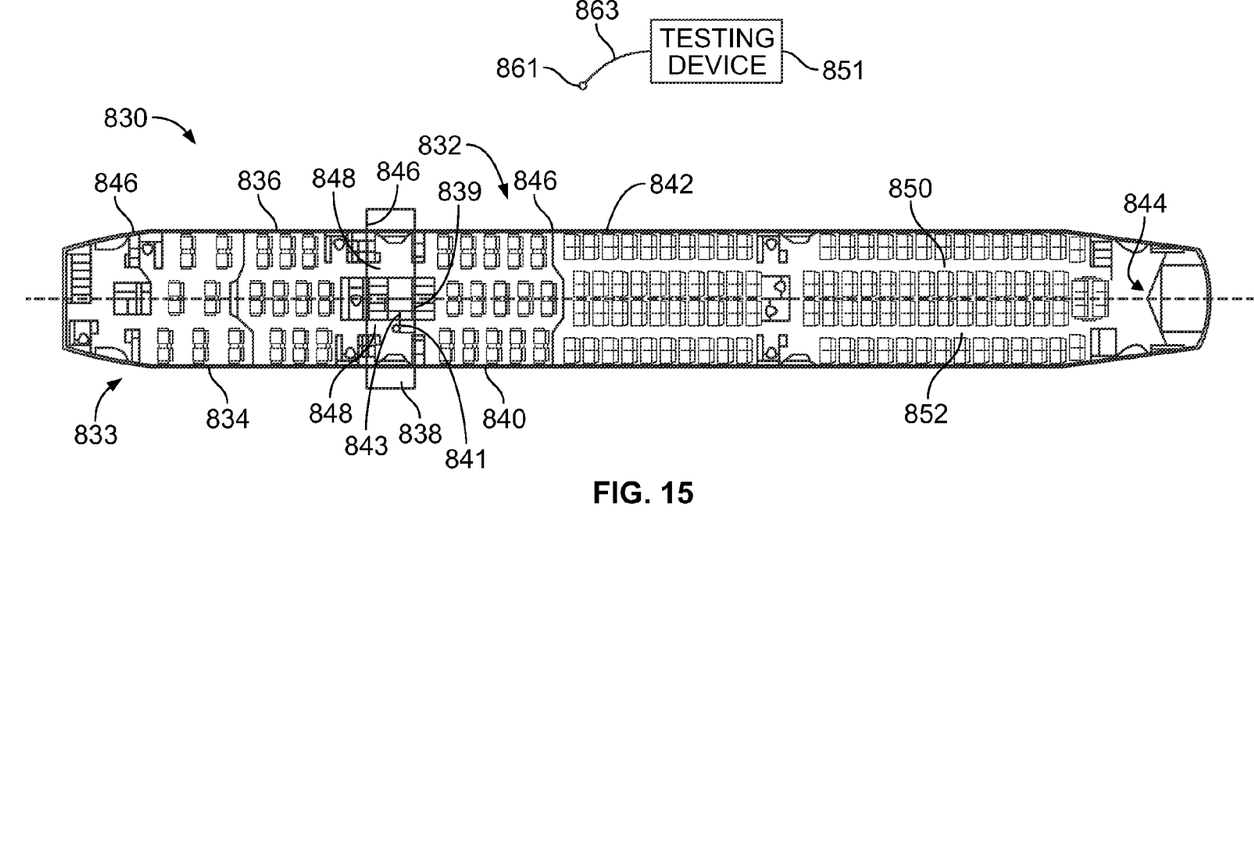
FIG. 15 is a diagrammatic representation of a layout of an internal cabin of an aircraft, according to an embodiment of the present disclosure.

FIG. 15 illustrates a top plan view of a layout of an internal cabin 830 of an aircraft, according to an embodiment of the present disclosure. The internal cabin 830 may be within a fuselage 832 of the aircraft. For example, one or more fuselage walls may define the internal cabin 830. The internal cabin 830 includes multiple sections, including a front section 833, a first class section 834, a business class section 836, a front galley station 838, an expanded economy or coach section 840, a standard economy of coach section 842, and an aft section 844, which may include multiple lavatories and galley stations. It is to be understood that the internal cabin 830 may include more or less sections than shown. For example, the internal cabin 830 may not include a first class section, and may include more or less galley stations than shown. Each of the sections may be separated by a cabin transition area 846, which may include curtain assemblies between structural features (such as monuments, overhead bins, or the like) within aisles 848.

The front galley station 838 may include a power panel 839. A first or shipside connector 841 may couple to the power panel 839 through a cable 843. Additional power panels, shipside connectors, and cables maybe located throughout the internal cabin. A testing device 851 may be used to test components within or coupled to the power panel 839 of the front galley station 838. For example, the testing device 851 may connect to the power panel 839 by way of a second or test connector 861 (that couples to the testing device 851 through a cable 863) removably connecting to the shipside connector 841, such as described above with respect to FIGS. 1-13. The testing device 851 may be a mobile structure that is configured to be moved into and out of the internal cabin 830.

As shown in FIG. 15, the internal cabin 830 includes two aisles 850 and 852 that lead to the aft section 844. Optionally, the internal cabin 830 may have less or more aisles than shown. For example, the internal cabin 830 may include a single aisle that extends through the center of the internal cabin 830 that leads to the aft section 844.

While various spatial and directional terms, such as top, bottom, lower, mid, lateral, horizontal, vertical, front and the like may be used to describe embodiments of the present disclosure, it is understood that such terms are merely used with respect to the orientations shown in the drawings. The orientations may be inverted, rotated, or otherwise changed, such that an upper portion is a lower portion, and vice versa, horizontal becomes vertical, and the like.

As used herein, a structure, limitation, or element that is "configured to" perform a task or operation is particularly structurally formed, constructed, or adapted in a manner corresponding to the task or operation. For purposes of clarity and the avoidance of doubt, an object that is merely capable of being modified to perform the task or operation is not "configured to" perform the task or operation as used herein.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments of the disclosure without departing from their scope. While the dimensions and types of materials described herein are intended to define the parameters of the various embodiments of the disclosure, the embodiments are by no means limiting and are exemplary embodiments. Many other embodiments will be apparent to those of skill in the art upon reviewing the above description. The scope of the various embodiments of the disclosure should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112(f), unless and until such claim limitations expressly use the phrase "means for" followed by a statement of function void of further structure.

This written description uses examples to disclose the various embodiments of the disclosure, including the best mode, and also to enable any person skilled in the art to practice the various embodiments of the disclosure, including making and using any devices or systems and performing any incorporated methods. The patentable scope of the various embodiments of the disclosure is defined by the claims, and may include other examples that occur to those skilled in the art. Such other examples are intended to be within the scope of the claims if the examples have structural elements that do not differ from the literal language of the claims, or if the examples include equivalent structural elements with insubstantial differences from the literal language of the claims.

What is claimed is:

1. An electrical system, comprising:
    a first electrical connector configured to be coupled to an electrical panel;
    a second electrical connector configured to be coupled to a testing device that is configured to test a component coupled to the electrical panel; and
    a retaining harness assembly that removably connects to the first and second electrical connectors to maintain a secure mating relationship between the first and second electrical connectors, wherein the retaining harness assembly comprises (a) a rear wall connected to opposed lateral walls, wherein a connecting chamber is defined between the rear wall and the lateral walls, (b) a lower ledge separated from an upper ledge by a flange-receiving slot, wherein a flange of the second electrical connector is received and retained within the flange-receiving slot, wherein the lower ledge exerts a first retaining force into the flange; and (c) a retaining collar that secures around a portion of a backplane of the second electrical connector and abuts into a torque ring of the second electrical connector, wherein the retaining collar exerts a second retaining force into the torque ring.

2. The electrical system of claim 1, wherein the first and second electrical connectors are configured to mate together in a linear, non-rotational direction.

3. The electrical system of claim 1, wherein one or both of the first and second electrical connectors is devoid of a threaded connection interface.

4. The electrical system of claim 1, wherein the retaining harness assembly biases the first electrical connector toward the second electrical connector.

5. The electrical system of claim 1, wherein the retaining harness assembly further comprises one or more lead-in walls that connect to the flange-receiving slot.

6. The electrical system of claim 1, wherein the retaining collar comprises one or more recessed areas configured to conform to a portion of an outer surface of the backplane.

7. The electrical system of claim 1, wherein the opposed lateral walls are configured to be deflected into an open position in order to remove the retaining harness assembly from the first and second electrical connectors.

8. An electrical system, comprising:
a shipside connector coupled to an electrical panel of a galley within an aircraft;
a test connector coupled to a testing device that is configured to test a component coupled to the electrical panel; and
a retaining harness assembly that removably connects to the shipside and test connectors to maintain a secure mating relationship between the shipside and test connectors, wherein the retaining harness assembly comprises: (a) a retainer housing secured around a portion of a backshell of the shipside connector; (b) a spring override ring secured around a portion of the retainer housing and operatively coupled to a torque ring of the shipside connector; and (c) a biasing spring having a first end retained by the retainer housing, wherein the spring override ring is configured to be rotated between a first position in which the biasing spring biases the spring override ring into the torque ring, and a second position in which the biasing spring is compressed toward the retainer housing, wherein compression of the biasing spring toward the retainer housing allows the torque ring to be rotated.

9. The electrical system of claim 8, wherein the shipside and test connectors are configured to mate together in a linear, non-rotational direction, wherein one or both of the shipside and test connectors is devoid of a threaded connection interface, wherein the retaining harness assembly biases the test connector toward the shipside connector.

10. The electrical system of claim 8, wherein the retaining harness assembly comprises one or more deflectable portions that are configured to be deflected into an open position in order to disconnect the retaining harness assembly from the shipside and test connectors.

11. An electrical system, comprising:
a first electrical connector configured to be coupled to an electrical panel;
a second electrical connector configured to be coupled to a testing device that is configured to test a component coupled to the electrical panel; and
a retaining harness assembly that removably connects to the first and second electrical connectors to maintain a secure mating relationship between the first and second electrical connectors wherein the retaining harness assembly comprises: (a) a securing strap that abuts into a flange of the second electrical connector, wherein the securing strap exerts a first retaining force into the flange, and (b) at least one retaining arm having a protuberance that abuts into a backplane of the first electrical connector and is supported over an edge of a torque ring, wherein the protuberance exerts a second retaining force into the torque ring.

12. The electrical system of claim 11, wherein the at least one retaining arm is configured to be deflected into an open position in order to disconnect the retaining harness assembly from the first and second electrical connectors.

13. The electrical system of claim 11, wherein the first and second electrical connectors are configured to mate together in a linear, non-rotational direction.

14. The electrical system of claim 11, wherein one or both of the first and second electrical connectors is devoid of a threaded connection interface.

15. The electrical system of claim 11, wherein the retaining harness assembly biases the first electrical connector toward the second electrical connector.

16. An electrical system, comprising:
a first electrical connector configured to be coupled to an electrical panel;
a second electrical connector configured to be coupled to a testing device that is configured to test a component coupled to the electrical panel; and
a retaining harness assembly that removably connects to the first and second electrical connectors to maintain a secure mating relationship between the first and second electrical connectors, wherein the retaining harness assembly comprises: (a) a retainer housing secured around a portion of a backshell of the first electrical connector, (b) a spring override ring secured around a portion of the retainer housing and operatively coupled to a torque ring of the first electrical connector, and (c) a biasing spring having a first end retained by the retainer housing.

17. The electrical system of claim 16, wherein the spring override ring is configured to be rotated between a first position in which the biasing spring biases the spring override ring into the torque ring, and a second position in which the biasing spring is compressed toward the retainer housing, wherein compression of the biasing spring toward the retainer housing allows the torque ring to be rotated.

18. The electrical system of claim 16, wherein the retainer housing comprises a shroud that retains the first end of the biasing spring.

19. The electrical system of claim 16, wherein the spring override ring connects to the torque ring through a ratchet interface.

20. The electrical system of claim 16, wherein at least a portion of the spring override ring is configured to cooperate with one or more tracks formed in the retainer housing to vary a compression of the biasing spring as the spring override ring is rotated relative to the retainer housing and the torque ring.

21. The electrical system of claim 16, wherein the first and second electrical connectors are configured to mate together in a linear, non-rotational direction.

22. The electrical system of claim 16, wherein one or both of the first and second electrical connectors is devoid of a threaded connection interface.

23. The electrical system of claim 16, wherein the retaining harness assembly biases the first electrical connector toward the second electrical connector.

* * * * *